United States Patent [19]
Gilmore et al.

[11] Patent Number: 5,557,142
[45] Date of Patent: Sep. 17, 1996

[54] SHIELDED SEMICONDUCTOR DEVICE PACKAGE

[75] Inventors: Peter B. Gilmore, Plantation; Kenneth R. Thompson, Sunrise, both of Fla.

[73] Assignee: Motorola, Inc., Schaumburg, Ill.

[21] Appl. No.: 650,326

[22] Filed: Feb. 4, 1991

[51] Int. Cl.$^6$ .......................... H01L 23/552; H01L 23/02
[52] U.S. Cl. .......................... 257/659; 257/687; 257/704; 257/787; 361/816; 361/820; 174/52.2
[58] Field of Search .......................... 357/72, 84; 361/424, 361/816, 818, 820; 174/352, 52.2; 257/659, 678, 687, 704, 787

[56] References Cited

U.S. PATENT DOCUMENTS

| | | | |
|---|---|---|---|
| 3,614,546 | 10/1971 | Avins | 317/234 R |
| 3,816,911 | 6/1974 | Knappenberger | 361/424 |
| 4,370,515 | 1/1983 | Donaldson | 361/424 |
| 4,567,317 | 1/1986 | Ehrlich et al. | 174/35 R |
| 4,641,224 | 2/1987 | Reimer | 174/35 R |

FOREIGN PATENT DOCUMENTS

| | | | |
|---|---|---|---|
| 0239314 | 9/1986 | Germany | 361/424 |
| 0014554 | 1/1990 | Japan | 357/84 |

*Primary Examiner*—Rolf Hille
*Assistant Examiner*—David Ostrowski
*Attorney, Agent, or Firm*—Dale W. Dorinski

[57] ABSTRACT

A shielded semiconductor package and a method for manufacturing the package is provided. The shielded semiconductor package comprises a metal coating (19) applied over an encapsulated semiconductor device (16). The device may be transfer molded or encapsulated by glob top technology. The metal coating (19) serves as a barrier to the transmission of electromagnetic or radio frequency energy, thereby shielding the semiconductor device (16). The shielded semiconductor package is manufactured by providing a metallization pattern (12 and 14) on a substrate (10) and mechanically attaching and electrically interconnecting a semiconductor device (16) to the metallization pattern. A resin (18) is transfer molded about the semiconductor device, the electrical interconnections (17), and the metallization pattern so as to form an assembly, and a metal coating (19) is applied via vacuum deposition or plating to interconnect with a portion of the metallization pattern.

9 Claims, 2 Drawing Sheets

SHIELDED SEMICONDUCTOR DEVICE PACKAGE

CROSS REFERENCES TO RELATED APPLICATIONS

This application is related to U.S. patent application Ser. No. 7/594480, filed on Oct. 9, 1990 which relates to an encapsulated electronic component with a metal shield formed about the component and soldered to the component, and is also related to U.S. Pat. application Ser. No. 7/620695 filed on Dec. 3, 1990, which relates to an encapsulated integrated circuit that is further encapsulated with a conductive epoxy material to provide shielding.

TECHNICAL FIELD

This invention relates generally to semiconductor device packages and more specifically to radio frequency shielded semiconductor device packages.

BACKGROUND

Semiconductor device packages or integrated circuit chip carriers find use in a variety of high-density electronics applications. The integrated circuits or semiconductor devices are protected from the external environment by encapsulation with an epoxy material (using glob top technology for example) or transfer molding a thermoset or thermoplastic resin about the device. This package provides protection from dust, humidity and other environmental factors which can destroy the delicate circuitry.

A major problem associated with these types of packages is that they do not provide shielding from radiation, such as radio frequency interference (RFI) or electromagnetic interference (EMI). This ability to shield high-frequency circuits, especially in electronic equipment such as two-way radios, is critical. Conventional shielding systems are generally characterized by a conductive metallic enclosure constructed to surround the device to be shielded. This enclosure acts either to protect the electrical equipment from external RFI or EMI signals or to prevent the escape of RFI or EMI signals generated by the device. Typically, these shielded enclosures are made from a conductive material that is electrically coupled to the surrounding area. In prior art, the shielded enclosures have been made by attaching a drawn metallic casing over the semiconductor device and soldering it to a substrate connected to the device.

Unfortunately, this method of shielding is extremely sensitive and very costly and cumbersome when used to shield integrated circuits because of 1) high temperatures generated during the soldering process for attaching the metal shield to the device and 2) the additional thickness or bulk required when adding a shield.

Heat generated by the soldering process is conducted to the integrated circuit and can result in damage to the circuit. In order to minimize the damage caused by the soldering operation, due care is required to control the soldering process in order to prevent jeopardizing the quality of the integrated circuit. The increase in the overall size of the shielded package is substantial, due to the additional thickness of the shield. This thickness results in a package that is larger than optimum.

Providing shielding for integrated circuits in these ways requires special mounting and holding fixtures for the shield and the integrated circuit package. As a result, a need exists for a method to provide RFI shielding to a high-density integrated circuit package that is economical, does not generate excessive temperatures, and provides a low-profile, high-density package.

SUMMARY OF THE INVENTION

Briefly, according to the invention, there is provided a semiconductor device package and a method for manufacturing the package. The semiconductor device package comprises a substrate having a metallization pattern having opposed sides. A semiconductor device is electrically interconnected to a first side of the metallization pattern. A resin material encapsulates the semiconductor device and the electrical interconnections, and a metal film or coating is deposited over the resin material and portions of the substrate.

The method of manufacturing the semiconductor device package comprises the steps of:

1. Providing a substrate comprising a sheet of material having a metallization pattern on at least one side;

2. Mechanically attaching and electrically interconnecting a semiconductor device to the metallization pattern;

3. Encapsulating the semiconductor device, the electrical interconnections, and portions of the metallization pattern so as to form an assembly; and 4. Coating the encapsulated assembly with a metal film or coating so as to provide an EMI or RFI shield for the semiconductor device.

DETAILED DESCRIPTION OF THE PREFERRED EMBODIMENT

Figure 1:
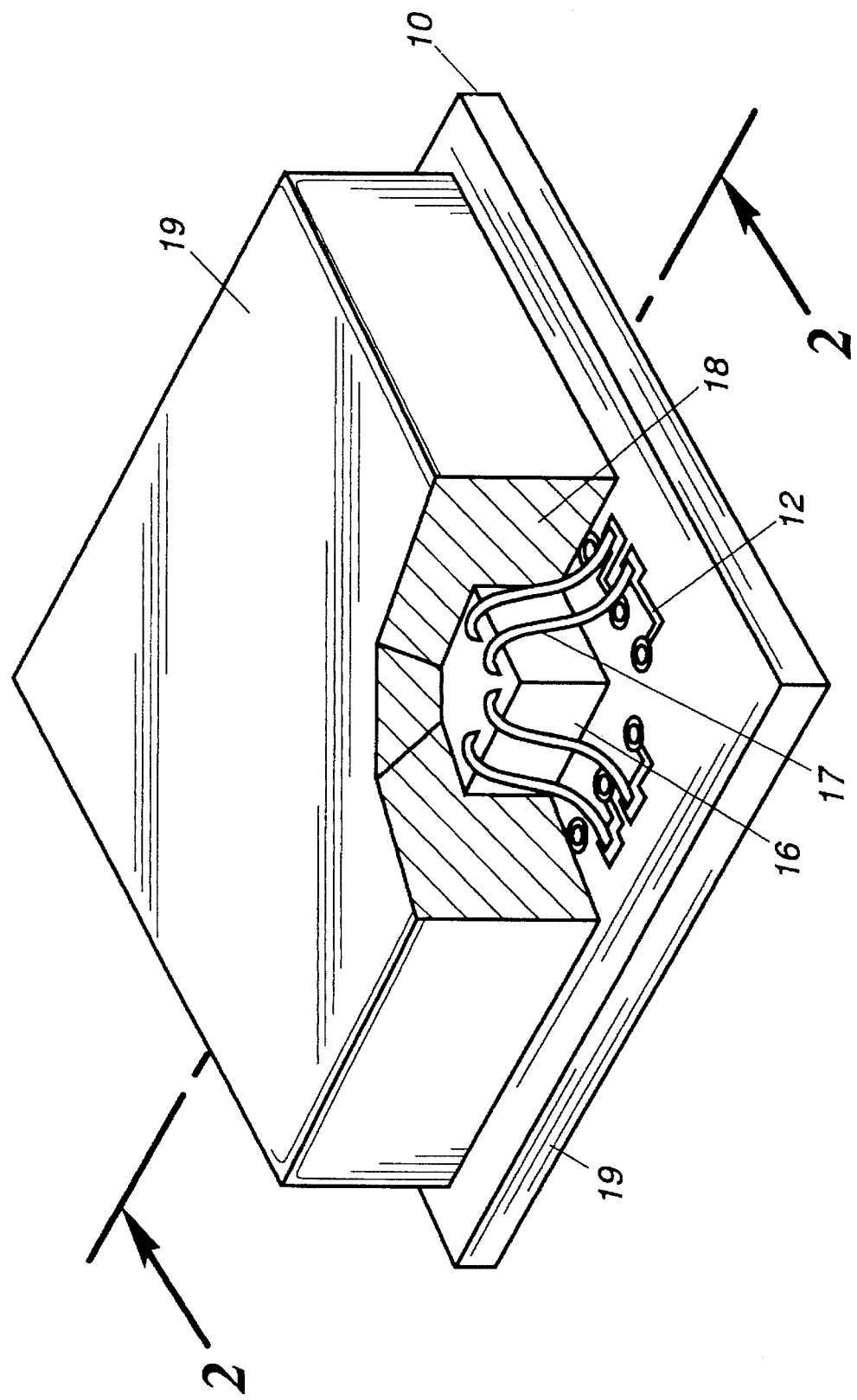
FIG. 1 is an isometric cut-away view of the shielded semiconductor device package in accordance with the present invention.

Referring to FIG. 1, a substrate 10 is provided as a carrier for a metallization pattern. The substrate material may be any one of a number of materials commonly used in the industry, such as polyester, polyimide, polyetherimide, polytetrafluoroethylene, glass reinforced printed circuit board materials, metal, ceramics, or glass, and may be rigid or flexible. Substrate thickness may vary from approximately 0.001 inches to 0.250 inches, with thicknesses ranging from 0.005 to 0.075 being preferred.

The metallization pattern consists of a conventional die mounting pad (not shown) with wire bond pads 12 arranged around the periphery of the die mount pad. A semiconductor device 16 is mechanically attached to the metallization pattern by means of a conductive adhesive or solder to bond the semiconductor device 16 to the die mounting pad. Nonconductive adhesives may also be utilized if electrical conductivity between the semiconductor device and the die mounting pad is not required. The semiconductor device 16 is then connected to the wire bond pads 12 by wirebonds 17. Other means of connecting semiconductor device 16 to the circuit pattern such as flip-chip bonding or tape-automated bonding (TAB) may be used interchangeably and still fall within the scope of the invention. These attachment methods are common in the industry and are well known to those skilled in the art.

The substrate and semiconductor device assembly is encapsulated by transfer molding or glob top technology. In the case of transfer molding, the assembly is placed into a transfer mold and a thermoplastic or thermoset transfer molding compound 18 is molded around the semiconductor device 16 to form a solid mass. The transfer molding compound 18 totally encapsulates the semiconductor device 16, the associated wirebonds 17, and portions of the metallization pattern and substrate. In the case of glob top encapsulation, a thermoset material is placed over the semiconductor device, and heated in an oven to flow out and encapsulate the device and the associated wirebonds. The heating cycle also cures the material to form a hard, monolithic material that protects the device from environmental damage.

The EMI/RFI shield is added to the package by coating the package with a metal film or coating 19. This is accomplished by, for example, vacuum depositing a metal onto the encapsulated assembly. Methods of vacuum deposition such as sputtering and evaporation have been found to be effective in coating a variety of electrically conductive and non-conductive surfaces. The metal may also be deposited by electroless plating the assembly, and other methods of coating these type of surfaces may also be used to advantage. After the coating has been added, the areas where a continuous metal coating is not desired, such as in the areas of the interconnection pads of the assembly, are etched away as by means of acids. The package is masked off with a photoresist, for example, and developed to expose the desired areas to the acids. After etching, the photoresist is removed to reveal the completed package. The openings in the conductive shield may also be defined by applying the photoresist prior to the initial metallization, in which case the photoresist is only applied over the areas where metal is not desired. In both of these methods, the metal is normally connected to at least one conductor of the substrate in order to interconnect the metal shield with the grounding circuit of the semiconductor device. This may be accomplished by not etching away the metal shield in the area of the ground pad, leaving the shield/ground pad interconnection intact. The package may be plated further with the same or different metals after the initial coating has been defined. Electroplating or electroless plating methods can be employed. Suitable metals for plating are copper, nickel, chrome, gold, tin, lead, bismuth, indium, silver, and combinations of these metals.

Figure 2:
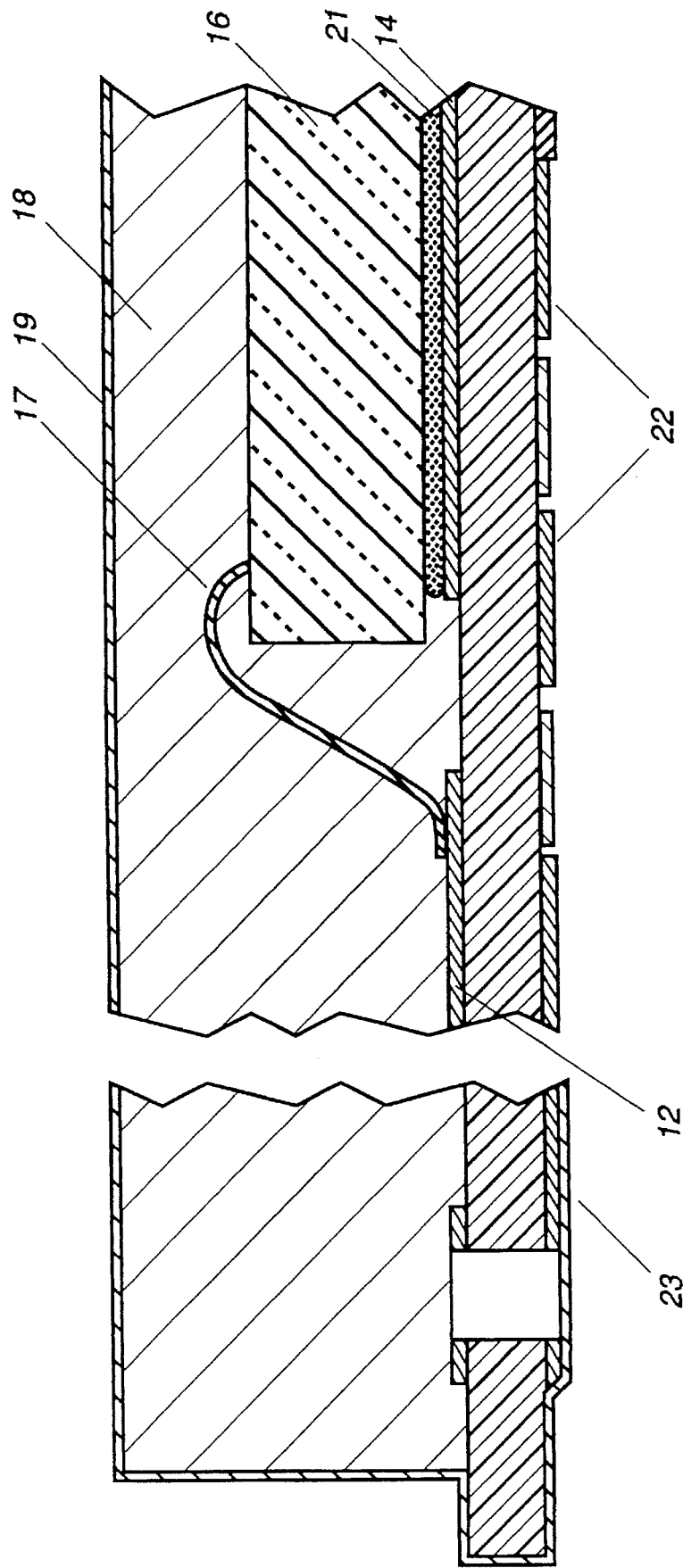
FIG. 2 is a cross-sectional view of the shielded semiconductor device package through section 2—2 of FIG. 1.

Referring now to FIG. 2, the package after molding consists of a semiconductor device 16 mounted on a die mounting pad 14 by means of a conductive adhesive 21. The device 16 is electrically interconnected to the wire bond pads 15 by means of wire bonds 17. The device, the upper surfaces of the metallization pattern and substrate, and the associated wirebonds are substantially encapsulated by transfer molding compound 18. The metal film or coating 19 is applied as described immediately above, and forms a continuous shield around the encapsulated package. The interconnection pads 22 are exposed and are not interconnected with the metal shield 19. The shielding metal does not have to appear on both sides of the side of the substrate, as shown in FIG. 2, but may be modified to leave the interconnection pads 22 unshielded. The metal shield 19 is connected to the package ground 23 by leaving a portion of the shield intact. The ground connection may also be made on the upper surface of the substrate by extending the grounding metallization beyond the perimeter of the molding compound. The thickness of the shield is increased, if desired, by additional plating.

Note that the overall package height is only increased by the thickness of the metal plating, and that no additional soldering or other type of physical interconnection means is required to interconnect the shield to the package ground. Thus the size and cost of the package is reduced in all cases, and significantly reduced in those cases where complex shields are required. The reliability is increased because the heat of soldering a separate metal shield is not required, thereby eliminating the potentially hazardous exposure of the semiconductor device to high temperatures. The method of producing semiconductor packages as elucidated in the present invention clearly realizes a number of advantages over the existing prior art by creating a package that is particularly useful in high density electronic applications, such as radios devices. The small size of the package, coupled with the improved shielding capability allow this package to be advantageously employed in applications such as portable radio transmitters, portable telephones, or portable radio receivers.

The examples shown in FIG. 1 and FIG. 2, while illustrative, are not meant to be considered limiting and other configurations and shapes of the semiconductor package may be envisioned to fall within the scope of the invention.

What is claimed is:

1. A shielded semiconductor device package, comprising:
    a semiconductor device;
    a substrate having the semiconductor device mechanically attached and electrically interconnected thereto;
    an encapsulant material encapsulating the semiconductor device; and
    a shield consisting of:
        a thin coating of metal deposited directly on the encapsulant material and portions of the substrate, the metal coating precisely conformed to the encapsulant material and the substrate and electrically coupled to the semiconductor device.

2. The shielded semiconductor device package according to claim 1, wherein the thin metal coating comprises a sputtered metal coating.

3. The shielded semiconductor device package according to claim 2, further comprising a second metal coating deposited directly on the vacuum-deposited coating by electroless plating.

4. The shielded semiconductor device package according to claim 1, further comprising a second metal coating deposited directly on the vacuum-deposited coating by electroplating.

5. A shielded semiconductor device package including a radio frequency shield for at least one semiconductor device, comprising:
    a substrate having upper and lower faces, the upper face having a metallization pattern;
    a semiconductor device mechanically attached to the upper face and electrically interconnected to the metallization pattern;
    a non-conductive material encapsulating the semiconductor device, the electrical interconnections, and portions of the upper face of the substrate; and
    a shield consisting of:
        a thin coating of metal deposited in a selected pattern directly on the non-conductive material and portions of the substrate, the metal coating precisely conformed to the non-conductive material and the substrate and electrically coupled to the semiconductor device in order to substantially reduce the ingress or egress of radio frequency signals through the semiconductor device package.

6. The shielded monolithic semiconductor device package according to claim 5, wherein the non-conductive material is transfer molded.

7. The shielded semiconductor device package according to claim 6, wherein the thin metal coating comprises a sputtered metal coating.

8. The shielded semiconductor device package according to claim 5, further comprising an array of surface mount solder pads on the lower face of the substrate, the solder pads electrically connected to the metallization pattern by vias through the substrate, at least some of the vias located away from the solder pads.

9. The shielded semiconductor device package according to claim 8, further comprising solder bumps on the solder pads.

* * * * *